(12) United States Patent
Otsubo

(10) Patent No.: US 10,219,362 B2
(45) Date of Patent: *Feb. 26, 2019

(54) ESD PROTECTION DEVICE

(71) Applicant: Murata Manufacturing Co., Ltd., Kyoto (JP)

(72) Inventor: Yoshihito Otsubo, Kyoto (JP)

(73) Assignee: MURATA MANUFACTURING CO., LTD., Kyoyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/784,280

(22) Filed: Oct. 16, 2017

(65) Prior Publication Data

US 2018/0049302 A1 Feb. 15, 2018

Related U.S. Application Data

(63) Continuation of application No. 14/950,565, filed on Nov. 24, 2015, now Pat. No. 9,826,611, which is a
(Continued)

(30) Foreign Application Priority Data

Jun. 24, 2013 (JP) .................................. 2013-131771

(51) Int. Cl.
*H05F 3/04* (2006.01)
*H01T 4/10* (2006.01)
(Continued)

(52) U.S. Cl.
CPC ................. *H05F 3/04* (2013.01); *H01T 1/20* (2013.01); *H01T 4/10* (2013.01); *H01T 4/12* (2013.01); *H05K 1/026* (2013.01); *H05K 3/4069* (2013.01)

(58) Field of Classification Search
CPC ................................. H02H 9/04; H02H 9/041
(Continued)

(56) References Cited

U.S. PATENT DOCUMENTS

2011/0222197 A1* 9/2011 Adachi ..................... H01T 4/12
361/56
2012/0279064 A1* 11/2012 Reinhardt ............. F01D 25/285
29/888
(Continued)

FOREIGN PATENT DOCUMENTS

CN 102754291 A 10/2012
CN 103140997 A 6/2013
(Continued)

OTHER PUBLICATIONS

International Search Report issued in Application No. PCT/JP2014/063166 dated Jul. 22, 2014.
(Continued)

*Primary Examiner* — Dharti H Patel
(74) *Attorney, Agent, or Firm* — Pearne & Gordon LLP

(57) ABSTRACT

An ESD protection device includes: a first insulating layer (2a); a second insulating layer (2b) stacked on the first insulating layer (2a); a first via conductor (6a) extending through the first insulating layer (2a) in a thickness direction; a discharge gap portion (10) provided so as to be in contact with the first via conductor (6a), between the first insulating layer (2a) and the second insulating layer (2b); a first wiring line (7a) that is arranged on a surface of the first insulating layer (2a) opposite to the discharge gap portion (10) and that is electrically connected to the first via conductor (6a); and a second wiring line (7b) that is arranged on one surface of the second insulating layer (2b) and that
(Continued)

includes a portion facing the first via conductor (6*a*) with at least the discharge gap portion (10) interposed therebetween.

12 Claims, 7 Drawing Sheets

Related U.S. Application Data continuation of application No. PCT/JP2014/063166, filed on May 19, 2014.

(51) Int. Cl.
*H01T 4/12* (2006.01)
*H01T 1/20* (2006.01)
*H05K 1/02* (2006.01)
*H05K 3/40* (2006.01)

(58) Field of Classification Search
USPC .......................................... 361/56
See application file for complete search history.

(56) References Cited

U.S. PATENT DOCUMENTS

| | | | |
|---|---|---|---|
| 2013/0141826 A1* | 6/2013 | Asakura | H01C 7/12 |
| | | | 361/56 |
| 2013/0201585 A1* | 8/2013 | Ikeda | H01T 4/12 |
| | | | 361/56 |
| 2013/0279064 A1 | 10/2013 | Otsubo | |

FOREIGN PATENT DOCUMENTS

| | | |
|---|---|---|
| JP | 08-102355 A | 4/1996 |
| JP | 2001-185322 A | 7/2001 |
| JP | 2001-217057 A | 8/2001 |
| JP | 2009-238563 A | 10/2009 |
| JP | 2011-119568 A | 6/2011 |
| WO | 2011/096335 A1 | 8/2011 |
| WO | 2012/043576 A1 | 4/2012 |
| WO | 2012090730 A1 | 7/2012 |

OTHER PUBLICATIONS

Translation of Written Opinion issued in Application No. PCT/JP2014/063166 dated Jul. 22, 2014.

* cited by examiner

ESD PROTECTION DEVICE

This application is a continuation of U.S. application Ser. No. 14/950,565 filed on Nov. 24, 2015 which is a continuation of International Application No. PCT/JP2014/063166 filed on May 19, 2014 which claims priority from Japanese Patent Application No. 2013-131771 filed on Jun. 24, 2013. The contents of these applications are incorporated herein by reference in their entireties.

BACKGROUND OF THE DISCLOSURE

Field of the Disclosure

The present disclosure relates to an ESD protection device. "ESD" stands for electro-static discharge. ESD is a phenomenon in which a strong discharge is generated when a charged conductive object, for example, a human body, comes into contact with or comes sufficiently close to another conductive object. An "ESD protection device" is a device for allowing an electric charge to flow to GND and protecting a circuit, when an electrostatic discharge is generated.

Description of the Related Art

These days, ESD protection devices for protecting electronic apparatuses from an electrostatic discharge are widely used.

An example of a circuit where an ESD protection device is used is illustrated in FIG. 13. A circuit to be protected (hereinafter called a "protected circuit") 502 is electrically connected to a terminal 503. The protected circuit 502 is, for example, an integrated circuit (IC). The terminal 503 represents a portion where a conductor or the like is exposed to the outside in a connector or the like. An ESD protection device 501 is connected to an end of a wiring line branching from a midpoint of a wiring line connecting the protected circuit 502 and the terminal 503 to each other. The ESD protection device 501 and the protected circuit 502 are separately grounded. As illustrated in FIG. 13, in a normal state, the discharge electrodes within the ESD protection device 501 are in a state in which a current does not flow between the discharge electrodes. When an ESD is generated as a result of, for example, a human body coming into contact with or coming sufficiently close to the terminal 503, a high voltage is applied to the terminal 503. At this time, without taking any steps, an overvoltage is applied to the protected circuit 502 and a current will flow as indicated by an arrow 92. However, when a discharge is generated between the discharge electrodes of the ESD protection device 501, a current will flow in a direction indicated by an arrow 91 due to the discharge and, hence, an overvoltage is not applied to the protected circuit 502. In other words, the protected circuit 502 is protected.

For example, Japanese Unexamined Patent Application Publication No. 2009-238563 (Patent Document 1) discloses a structure called an "overvoltage protection component" in which a hollow functioning as a discharge portion is formed inside a base body formed of an insulator and discharge electrodes face each other within this hollow. It is disclosed in Patent Document 1 that the discharge electrodes are formed by printing, plating, or the like.

For example, Japanese Unexamined Patent Application Publication No. 2001-217057 (Patent Document 2) discloses a structure called a "chip-type surge absorption device" in which internal electrodes face each other inside an insulating ceramic sintered body. A discharge space is formed so as to be interposed between the internal electrodes. It is disclosed in Patent Document 2 that the discharge space is filled with a carbon paste by using screen printing, and the carbon paste is burnt down at sintering time.

Patent Document 1: Japanese Unexamined Patent Application Publication No. 2009-238563
Patent Document 2: Japanese Unexamined Patent Application Publication No. 2001-217057

BRIEF SUMMARY OF THE DISCLOSURE

In Patent Document 1, since the discharge electrodes are formed by printing, plating, or the like, the discharge electrodes are thin conductive layers attached to the surface of an insulator. At a discharge time, electrons collide with this discharge electrode and, hence, the discharge electrode may become detached due to the impact caused by the collision of the electrons. In Patent Document 1, a cavity is provided in an insulating sheet, the cavity is filled with an acrylic resin as a discharge portion forming material, and the acrylic resin evaporates in a firing process to form a hollow. Since the hollow is formed in this way and the discharge electrodes facing each other with the hollow interposed therebetween are formed by printing or the like, a decrease in the gap between the discharge electrodes, i.e., a sufficiently narrow gap, was not realized.

Also in Patent Document 2, since the chip-type surge absorption device is formed by using a printing method and a green sheet method, a sufficiently narrow gap between the discharge electrodes was not realized.

Hence, it is an object of the present disclosure to provide an ESD protection device that realizes a further reduction in a gap between the discharge electrodes and that can alleviate a problem in that the discharge electrodes become detached.

To accomplish the above object, an ESD protection device based on the present disclosure includes: a first insulating layer; a second insulating layer stacked on the first insulating layer; a first via conductor extending through the first insulating layer in a thickness direction; a discharge gap portion provided so as to be in contact with the first via conductor, between the first insulating layer and the second insulating layer; a first wiring line arranged on a surface of the first insulating layer opposite to the discharge gap portion and that is electrically connected to the first via conductor; and a second wiring line arranged on one surface of the second insulating layer and including a portion facing the first via conductor with at least the discharge gap portion interposed therebetween.

According to the present disclosure, a further reduction in a gap between discharge electrodes is realized and a problem in that the discharge electrodes become detached can be alleviated.

DETAILED DESCRIPTION OF THE DISCLOSURE

When an ESD protection device is produced by stacking insulating sheets on top of one another, a discharge portion may be formed by providing a hollow having a thickness of a single insulating sheet. However, with this configuration, the thickness of a hollow is approximately determined by the thickness of the insulating sheet, and a sufficiently narrow gap cannot be realized.

A gap may also be formed such that by arranging neighboring discharge electrodes on the same surface and forming a gap between the discharge electrodes arranged in the left-right direction. However, in the case in which the discharge electrodes described above are formed by printing, the outlines of the discharge electrodes planarly viewed are not stable due to a blur in printing. Hence, a large clearance is needed to avoid a short circuit and, therefore, a small gap cannot be precisely formed. Specifically, when the intended gap is a gap smaller than about 20 μm, it was difficult to form the gap in a stable and accurate manner.

On the other hand, when a layer is formed by printing, the variation of the thickness of the layer is small and a blur in printing is seldom observed in the thickness direction. The thickness of a layer formed by printing can be controlled by the amount of the solid component of a paste or the ejected amount of a paste.

In consideration of these situations, the inventor has accomplished the following disclosure.

First Embodiment

An ESD protection device in a first embodiment based on the present disclosure will be described with reference to FIG. 1.

Figure 1:
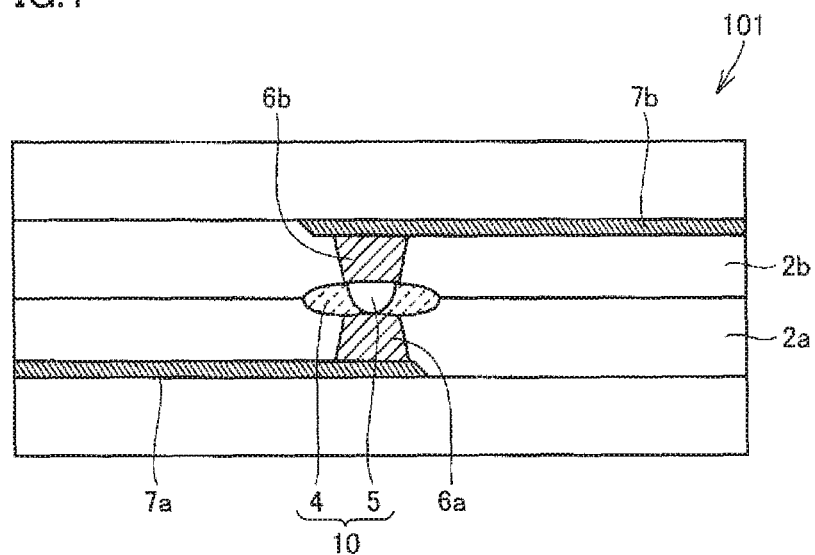
FIG. 1 is a sectional view of an ESD protection device in a first embodiment based on the present disclosure.

As illustrated in FIG. 1, an ESD protection device 101 in the present embodiment includes a first insulating layer 2a, a second insulating layer 2b stacked on the first insulating layer 2a, a first via conductor 6a extending through the first insulating layer 2a in the thickness direction, a discharge gap portion 10 provided between the first insulating layer 2a and the second insulating layer 2b so as to be in contact with the first via conductor 6a, a first wiring line 7a arranged on the surface of the first insulating layer 2a opposite to the discharge gap portion 10 and electrically connected to the first via conductor 6a, and a second wiring line 7b that is arranged on one of the surfaces of the second insulating layer 2b and that includes a portion facing the first via conductor 6a with at least the discharge gap portion 10 interposed therebetween.

The first insulating layer 2a and the second insulating layer 2b are, for example, ceramic layers. In the example illustrated in FIG. 1, the discharge gap portion 10 includes a discharge auxiliary electrode 4 and a hollow 5.

With the configuration of the ESD protection device 101 in the present embodiment, as described later, the structure of the discharge gap portion can be formed by printing with a paste. With this configuration, the thickness of the discharge gap portion can be controlled by the thickness of a layer formed by printing. The first via conductor 6a and a second via conductor 6b correspond to respective discharge electrodes. The structure of the discharge electrodes is not limited to this, and may be any structure in which discharge electrodes face each other with the discharge gap portion 10 interposed therebetween. The ESD protection device 101 illustrated here has a structure in which the first via conductor 6a as one discharge electrode and the second via conductor 6b as the other discharge electrode face each other with the discharge gap portion 10 interposed therebetween. The details of the discharge gap portion 10 will be described later.

The first via conductor 6a functioning as the discharge electrode can be formed by using a method of filling a hole with a conductive paste rather than a method of printing and, hence, can have a sufficient thickness. As a result, unlike a configuration in which a thinfilm, formed as a discharge electrode by printing, is attached, the discharge electrodes will not become easily detached or lost even when discharges are repeated.

In the present embodiment, further reduction in the gap between the discharge electrodes can be realized, and further, a problem in that the discharge electrodes become detached can be alleviated.

As shown in the present embodiment, it is preferable that the first via conductor 6a have a tapered shape which is narrower on the discharge gap portion 10 side. This is due to the fact that by employing this configuration, the electric charge density in the inside of the first via conductor 6a can be enhanced at a side near the discharge gap portion 10 and, hence, a discharge between the discharge electrodes is more likely to be generated. Further, due to this orientation of the tapered shape, the discharge electrode is unlikely to be detached.

As shown in the present embodiment, preferably, the ESD protection device includes the second via conductor 6b which extends through the second insulating layer 2b in the thickness direction, one end of which in the thickness direction is electrically connected to the second wiring line 7b, and the other end of which includes the second via conductor 6b in contact with the discharge gap portion 10, where the second via conductor 6b faces the first via conductor 6a with the discharge gap portion 10 therebetween, and the second wiring line 7b is arranged on the surface of the second insulating layer 2b opposite to the discharge gap portion 10. By employing this configuration, since a structure is obtained in which the discharge gap portion 10 is interposed between two via conductors functioning as the discharge electrodes, a discharge between the discharge electrodes is more likely to be generated.

As shown in the present embodiment, it is preferable that the second via conductor 6b have a tapered shape which is narrower at a side near the discharge gap portion 10. This is due to the fact that by employing this configuration, the electric charge density in the inside of the second via conductor 6b can be enhanced at a side near the discharge gap portion 10 and, hence, a discharge between the discharge electrodes is more likely to be generated.

As shown in the present embodiment, it is preferable that the discharge auxiliary electrode 4 be arranged in the discharge gap portion 10. This is due to the fact that by employing this configuration, a discharge is more likely to be generated due to the action of the discharge auxiliary electrode 4. The discharge gap portion 10 will be described in more detail in the description of a manufacturing method which follows.

Preferably, the discharge gap portion 10 has a structure in which, in plan view, the peripheral portion is surrounded by the discharge auxiliary electrode 4 with the hollow 5 as the center. It is preferable that the discharge auxiliary electrode 4 contain semiconductor ceramic particles. Further, it is preferable that the discharge auxiliary electrode 4 contain conductive particles coated with an insulating material. This is because a discharge is more likely to be generated at the discharge gap portion 10 by employing this configuration.

Figure 2:
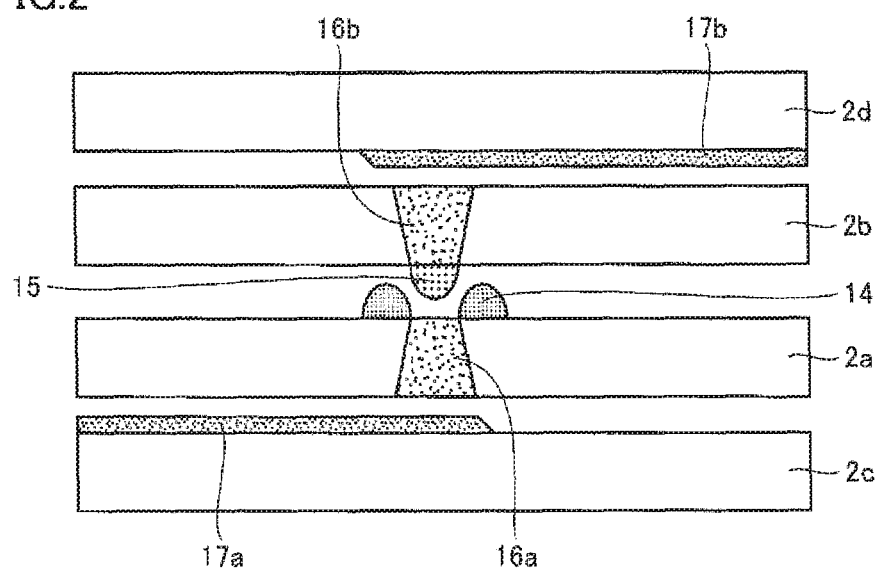
FIG. 2 is an explanation diagram of a state of the ESD protection device in the first embodiment based on the present disclosure before layer stacking.

A manufacturing method for the ESD protection device 101 illustrated in FIG. 1 will be described. FIG. 2 illustrates the state of the ESD protection device 101 before layer stacking. The ESD protection device 101 is produced by stacking a plurality of insulator sheets on top of one another. The insulator sheets are, for example, ceramic sheets, but may be insulator sheets of other types, not limited to ceramic sheets. The following illustrates an exemplary case in which the insulating layers included in the ESD protection device 101 are ceramic layers.

A hole is formed in a ceramic sheet which is to become the first insulating layer 2a, and the hole is filled with a conductive paste 16a. The conductive paste 16a is to become the first via conductor 6a later. On the other hand, a hole is formed in a ceramic sheet which is to become the second insulating layer 2b, and the hole is filled with a conductive paste 16b. The orientation of a tapered shape is determined in accordance with a surface of the sheet from which the hole is started to be formed and, hence, the orientation of the tapered shape of a finally formed via conductor can be appropriately selected by choosing an appropriate surface from which the hole is started to be formed in the ceramic sheet. The conductive pastes 16a and 16b are, for example, metal pastes.

A discharge auxiliary electrode material 14 is printed on the top surface of the first insulating layer 2a. A hollow-forming paste 15 is formed printed on the bottom surface. In this way, the first insulating layer 2a and the second insulating layer 2b enter the state illustrated in FIG. 2. In the example illustrated in FIG. 2, the discharge auxiliary electrode material 14 is printed in the shape of a ring, and the hollow-forming paste 15 is printed at a position which is within the ring of the discharge auxiliary electrode material 14.

Note that the discharge auxiliary electrode material 14 is a material that can be used to form a discharge auxiliary electrode through firing. This may be, for example, insulating ceramic powder mixed with semiconductor ceramic powder. Alternatively, the discharge auxiliary electrode material 14 may be formed of conductive particles coated with an insulating material. In the case of "conductive particles coated with an insulating material", "coating" may refer to a complete coating or an incomplete coating. Coating may have a configuration in which very small insulating particles are attached to the surfaces of conductive particles. Alternatively, coating may refer to particles having a core-shell structure in which conductive particles are housed within an insulating film. "Conductive particles" may be Cu particles. Other than these, particles of a conductive material such as Au, Al, Ag, or Ni may be appropriately used. The "insulating material" with which conductive particles are coated may be, for example, $Al_2O_3$. As the "semiconductor ceramic powder", ceramic powder formed of carbide such as SiC or a semiconductor ceramic such as a transition metal oxide like MnO, NiO, CoO, or CuO may preferably be used. The semiconductor ceramic powder may be, for example, SiC particles coated with $SiO_2$. The discharge auxiliary electrode material 14 may be a mixture of semiconductor ceramic powder and conductive particles coated with an insulating material.

The hollow-forming paste 15 is a material that can disappear at a firing temperature. This may be a material that includes, as the main material, beads of resin that can disappear, for example, at a firing temperature. Examples of resin satisfying such a condition include acrylic resin and polystyrene resin. The hollow-forming paste 15 can be obtained by mixing these synthesized resin beads with, for example, binder resin and a solvent, as necessary.

The main material of the hollow-forming paste 15 is not limited to resin. Materials other than resin may be used if the materials can disappear at a firing temperature. For example, wax having a certain degree of stiffness may be used. The main material of the hollow-forming paste 15 is not limited to a bead-containing material. For example, a resin material containing column-shaped particles may be used, and the shape is not limited.

As illustrated in FIG. 2, an insulating layer 2c is stacked on the underside of the first insulating layer 2a. An insulating layer 2d is stacked on the upper side of the second insulating layer 2b. In the example illustrated here, the insulating layers 2c and 2d are also ceramic sheets similarly to the first insulating layer 2a and the second insulating layer 2b.

On the top surface of the insulating layer 2c, a conductive paste layer 17a which is to become the first wiring line 7a later is formed in advance. On the bottom surface of the insulating layer 2d, a conductive paste layer 17b which is to become the second wiring line 7b later is formed in advance. The conductive paste layers 17a and 17b can be formed by printing with a conductive paste on the surfaces of the insulating layers.

Although it was assumed in this example that the ESD protection device is produced by stacking a total of four layers of ceramic sheets on top of one another, the total number of the layers is not limited to this.

As illustrated in FIG. 2, the insulating layer 2c, the first insulating layer 2a, the second insulating layer 2b, and the insulating layer 2d are stacked on top of one another sequentially in this order from the bottom and these layers are integrally fired. As a result, the whole device is unified, whereby the ESD protection device 101 illustrated in FIG. 1 is obtained.

At the time of firing, the discharge auxiliary electrode material 14 becomes the discharge auxiliary electrode 4, and the hollow-forming paste 15 disappears, thereby forming the hollow 5. At the time of firing, the conductive paste layer 17a becomes the first wiring line 7a and the conductive paste layer 17b becomes the second wiring line 7b.

Second Embodiment

Figure 3:
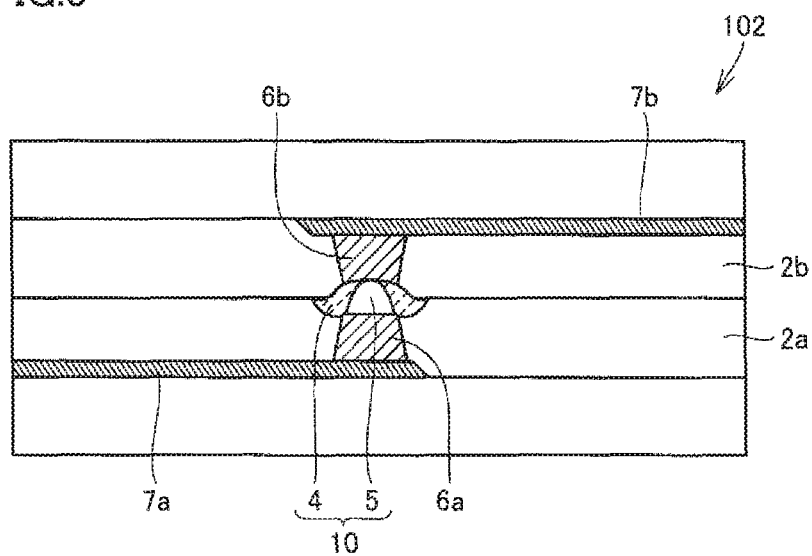
FIG. 3 is a sectional view of an ESD protection device in a second embodiment based on the present disclosure.

Referring to FIG. 3, an ESD protection device in a second embodiment based on the present disclosure will be described.

As illustrated in FIG. 3, an ESD protection device 102 in the present embodiment has a configuration which is basically similar to that of the ESD protection device 101 described in the first embodiment. In the discharge gap portion 10, the hollow 5 has a shape which becomes narrower toward the bottom in the ESD protection device 101 of the first embodiment, but in the present embodiment, the hollow 5 has a shape which becomes narrower toward the top. In addition, in the present embodiment, the shape of the discharge auxiliary electrode 4 is slightly different from that in the first embodiment. However, also in the present embodiment, the discharge gap portion 10 has a structure in which, in plan view, the peripheral portion is surrounded by the discharge auxiliary electrode 4 with the hollow 5 as the center.

Also in the ESD protection device 102 shown in the present embodiment, effects similar to those of the first embodiment can be obtained.

Figure 4:
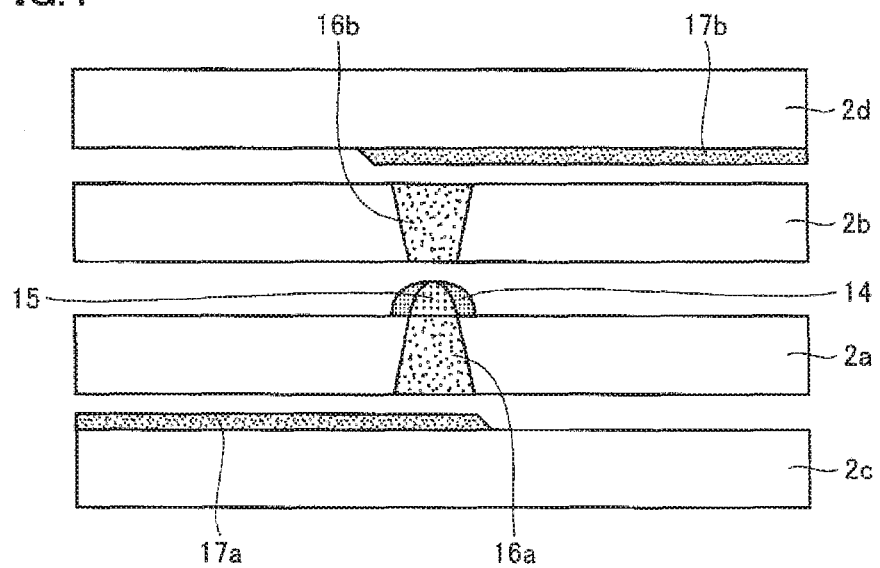
FIG. 4 is an explanation diagram of a state of the ESD protection device in the second embodiment based on the present disclosure before layer stacking.

FIG. 4 illustrates the state of the ESD protection device 102 in the present embodiment prior to layer stacking. The present embodiment has a configuration similar to that illustrated in FIG. 2 of the first embodiment. However, in the present embodiment, rather than applying materials that are to form the discharge gap portion 10 to different surfaces through printing, both of the materials are applied to a single surface by printing. In other words, both of the discharge auxiliary electrode material 14 and the hollow-forming paste 15 are applied to the top surface of the first insulating layer 2a by printing. In this case, through printing, the hollow-forming paste 15 is first applied to the center of a location, in plan view, of the top surface of the first insulating layer 2a corresponding to the top surface of the conductive paste 16a, and then, the discharge auxiliary electrode material 14 is applied so as to form a ring surrounding the hollow-forming paste 15. As illustrated in FIG. 4, the ESD protection device 102 illustrated in FIG. 3 is obtained by preparing the insulating layers, stacking these layers on top of one another, and integrally firing them.

Third Embodiment

Figure 5:
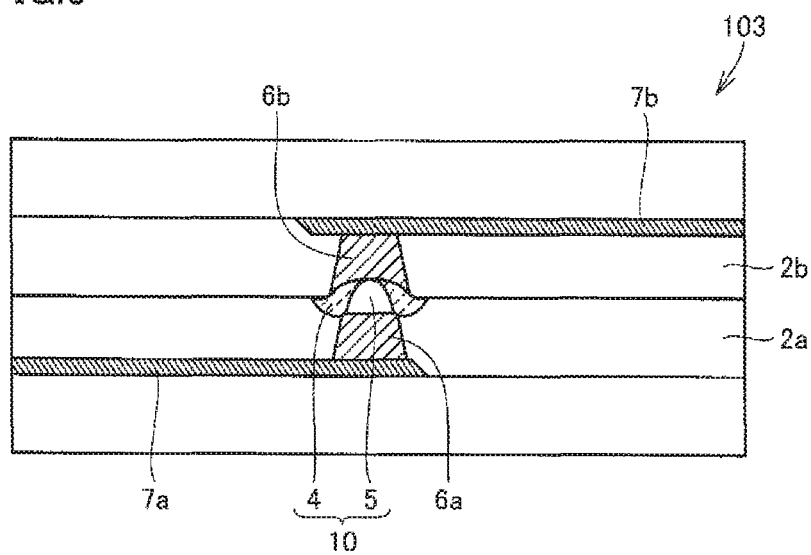
FIG. 5 is a sectional view of an ESD protection device in a third embodiment based on the present disclosure.

Referring to FIG. 5, an ESD protection device in a third embodiment based on the present disclosure will be described.

As illustrated in FIG. 5, an ESD protection device 103 in the present embodiment has a configuration which is basically similar to that of the ESD protection device 102 described in the second embodiment. However, unlike the ESD protection device 102, the second via conductor 6b provided in the second insulating layer 2b has a tapered shape which is oriented such that the shape becomes narrower toward the top. In other words, the second via conductor 6b has a tapered shape which is wider at a side near the discharge gap portion 10.

In the present embodiment, although the degree of electric charge concentration at the end of the second via conductor 6b at a side nearer to the discharge gap portion 10 is inferior to that in the second embodiment, a certain level of effect in an embodiment of the present disclosure is obtained with regard to the other points.

Figure 6:
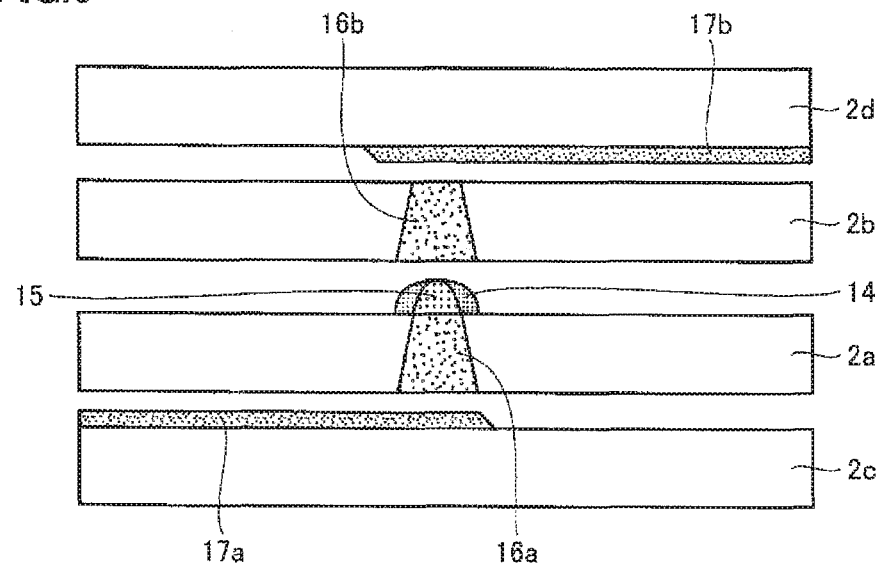
FIG. 6 is an explanation diagram of a state of the ESD protection device in the third embodiment based on the present disclosure before layer stacking.

The ESD protection device 103 in the present embodiment can be produced by stacking a plurality of insulating layers on top of one another as illustrated in FIG. 6. In this case, the orientations of the tapered shapes of the first via conductor 6a of the first insulating layer 2a and the second via conductor 6b of the second insulating layer 2b can be aligned. Hence, the layer stacking operations are easy because one of the insulating layers need not be reversed during the layer stacking.

Fourth Embodiment

Figure 7:
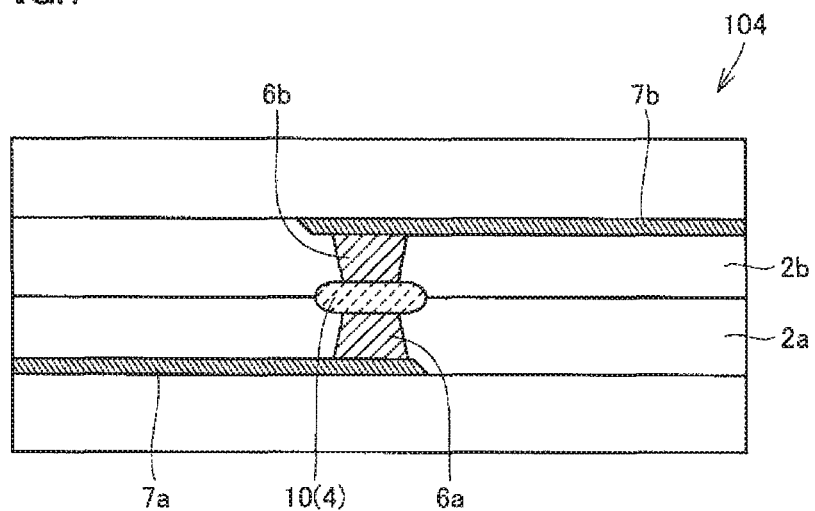
FIG. 7 is a sectional view of an ESD protection device in a fourth embodiment based on the present disclosure.

Referring to FIG. 7, an ESD protection device in a fourth embodiment based on the present disclosure will be described.

As illustrated in FIG. 7, an ESD protection device 104 in the present embodiment has a configuration which is basically similar to that of the ESD protection device 101 described in the first embodiment. However, the whole discharge gap portion 10 functions as the discharge auxiliary electrode 4.

Also, in the present embodiment, further reduction in the gap between the discharge electrodes can be realized, and further, a problem in that the discharge electrodes become detached can be alleviated.

A configuration such as the one in the present embodiment can be realized by applying a sufficient amount of the discharge auxiliary electrode material 14 through printing to the top surface of the first insulating layer 2a before layer stacking without applying a hollow-forming paste through printing. The discharge auxiliary electrode material 14 may be applied to the bottom surface of the second insulating layer 2b by printing instead of the top surface of the first insulating layer 2a. Alternatively, the discharge auxiliary electrode material 14 may be applied to both of the top surface of the first insulating layer 2a and the bottom surface of the second insulating layer 2b by printing.

Note that the configuration in which both of the discharge auxiliary electrode 4 and the hollow 5 are provided within the discharge gap portion 10 as shown in the first embodiment is preferable over the configuration in which the whole discharge gap portion 10 functions as the discharge auxiliary electrode 4 as shown in the present embodiment, because a load on the discharge auxiliary electrode 4 can be alleviated.

Fifth Embodiment

Figure 8:
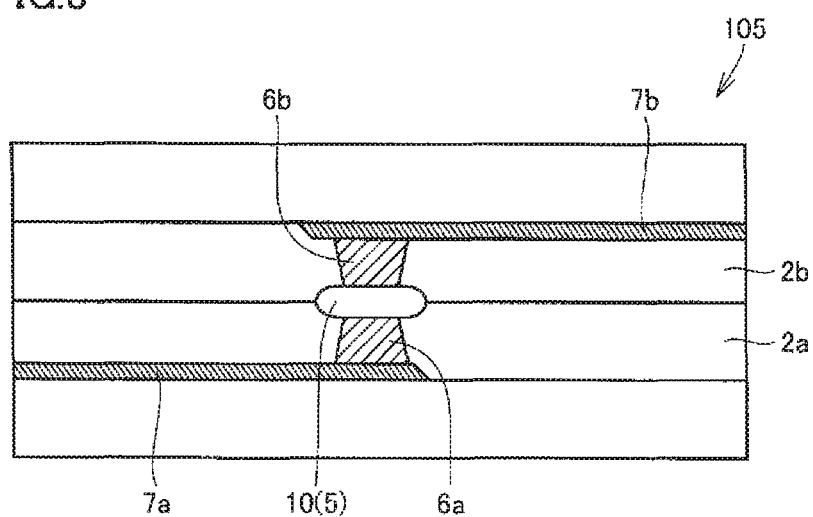
FIG. 8 is a sectional view of an ESD protection device in a fifth embodiment based on the present disclosure.

Referring to FIG. 8, an ESD protection device in a fifth embodiment based on the present disclosure will be described.

As illustrated in FIG. 8, an ESD protection device 105 in the present embodiment has a configuration which is basically similar to that of the ESD protection device 101 described in the first embodiment. However, the whole of the discharge gap portion 10 is the hollow 5. As shown in the present embodiment, the discharge gap portion 10 may be the hollow 5.

Also, according to the present embodiment, further reduction in the gap between the discharge electrodes can be realized, and further, a problem in that the discharge electrodes become detached can be alleviated. Also, in the present embodiment, a certain level of effect in the present disclosure can be obtained, although it is preferable to provide the discharge auxiliary electrode 4 as in the first embodiment since a discharge is more likely to be generated and, hence, a discharge starting voltage can be lowered.

A configuration such as the one in the present embodiment can be realized by applying a sufficient amount of the hollow-forming paste 15 to the top surface of the first insulating layer 2a through printing before layer stacking without applying a discharge auxiliary electrode material through printing. The hollow-forming paste 15 may be applied by printing to the bottom surface of the second insulating layer 2b instead of the top surface of the first insulating layer 2a. Alternatively, the hollow-forming paste 15 may be applied by printing to both of the top surface of the first insulating layer 2a and the bottom surface of the second insulating layer 2b.

As described in the embodiments up to here, it is preferable that the structure in which the first via conductor 6a and the second via conductor 6b face each other with the discharge gap portion 10 therebetween be housed so as to be arranged in the thickness direction and so as to have a thickness smaller than the combined thickness of two insulating layers of the first insulating layer 2a and the second insulating layer 2b. By employing this configuration, reduction in the gap can be realized while suppressing the thickness of the whole device. Further, it is preferable that the discharge auxiliary electrode 4 be arranged in the discharge gap portion 10 in this case. According to the present disclosure, even the structure including the discharge auxiliary electrode can be housed so as to have a thickness smaller than the combined thickness of two insulating layers.

Up to here, configurations that include the second via conductor 6b in addition to the first via conductor 6a have been described. However, the second via conductor 6b is not essential to the present disclosure. Next, an embodiment without the second via conductor 6b will be described.

Sixth Embodiment

Figure 9:
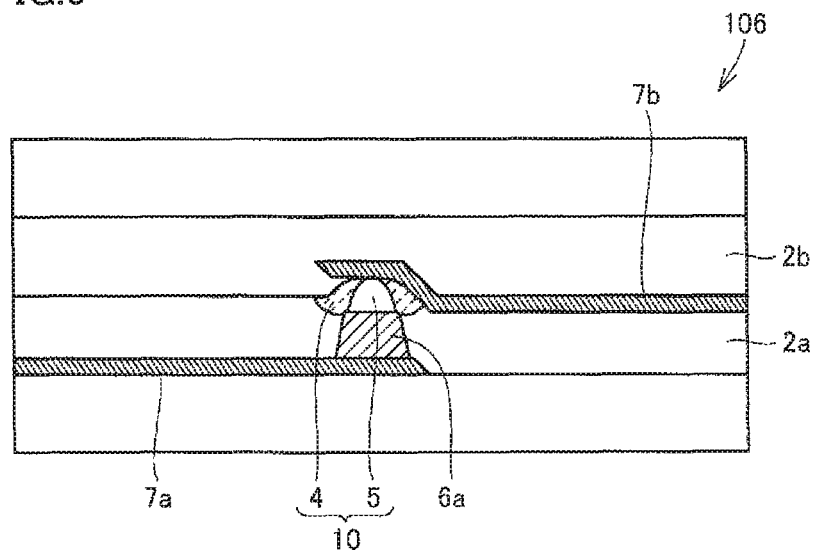
FIG. 9 is a sectional view of an ESD protection device in a sixth embodiment based on the present disclosure.

Referring to FIG. 9, an ESD protection device in a sixth embodiment based on the present disclosure will be described.

As illustrated in FIG. 9, an ESD protection device 106 in the present embodiment includes a first insulating layer 2a, a second insulating layer 2b stacked on the first insulating layer 2a, a first via conductor 6a extending through the first insulating layer 2a in the thickness direction, a discharge gap portion 10 provided between the first insulating layer 2a and the second insulating layer 2b so as to be in contact with the first via conductor 6a, a first wiring line 7a arranged on the surface of the first insulating layer 2a opposite to the discharge gap portion 10 of the first insulating layer 2a and electrically connected to the first via conductor 6a, and a second wiring line 7b that is arranged on one of the surfaces of the second insulating layer 2b and that includes a portion facing the first via conductor 6a with at least the discharge gap portion 10 interposed therebetween.

The phrase "a second wiring line 7b that is arranged on one of the surfaces of the second insulating layer 2b" means that when the second via conductor 6b is provided so as to extend through the second insulating layer 2b, as shown in the first to fifth embodiments, the second wiring line 7b may be provided on the top surface of the second insulating layer 2b, but when the second via conductor 6b does not exist in the second insulating layer 2b, as shown in the present embodiment, the second wiring line 7b is provided on the bottom surface of the second insulating layer 2b. In other words, the second wiring line 7b is provided on the bottom surface of the second insulating layer 2b at least in the present embodiment.

In the present embodiment, the first via conductor 6a and the second wiring line 7b correspond to respective discharge electrodes. The ESD protection device 106 illustrated here has a structure in which the first via conductor 6a as one discharge electrode and the second wiring line 7b as the other discharge electrode face each other with the discharge gap portion 10 interposed therebetween.

The details of the discharge gap portion 10 may be determined on the basis of any concept described in the first to fifth embodiments.

Also, according to the present embodiment, further reduction in the gap between the discharge electrodes can be realized, and further, a problem in that the discharge electrodes become detached can be alleviated.

As shown in the first to fifth embodiments, when a configuration is employed in which the second via conductor 6b is provided so as to extend through the second insulating layer 2b and is made to function as a discharge electrode, and in which via conductors face each other, it is easy for the electric charges to be concentrated at the tip of the via conductor by utilizing the shape of the via conductor protruding in the thickness direction and, hence a discharge is more likely to be generated. In other words, this configuration is preferable since a starting voltage can be easily lowered. However, even with the configuration in which the via conductor exists only on the one side of the discharge gap portion as shown in the present embodiment, a certain level of effect in the present disclosure can be obtained.

Figure 10:
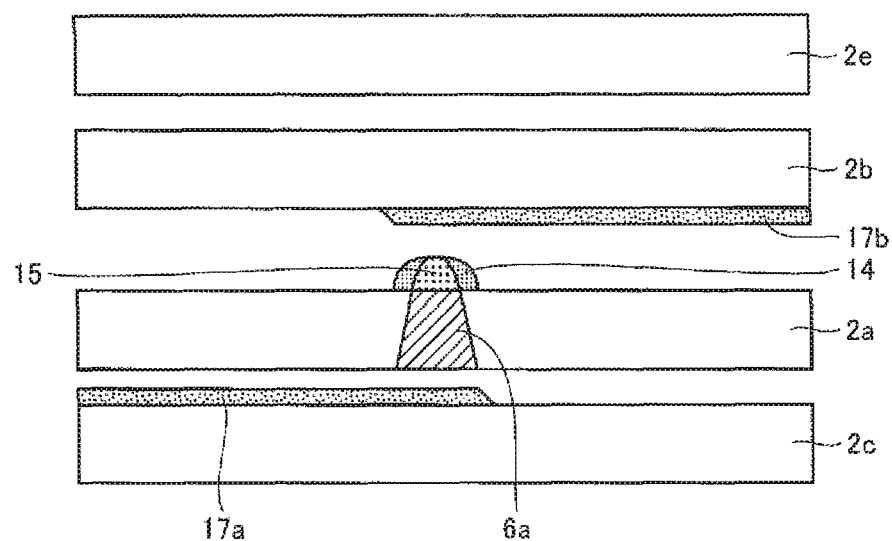
FIG. 10 is an explanation diagram of a state of the ESD protection device in the sixth embodiment based on the present disclosure before layer stacking.

The ESD protection device 106 in the present embodiment can be produced by stacking a plurality of insulating layers on top of one another as illustrated in FIG. 10. In this case, there is no need to make a hole in the second insulating layer 2b or fill it with a conductive paste. Hence, this is favorable from the viewpoint of reducing the number of processes.

Example Experiments

To examine the discharge responsiveness to ESD, a plurality of types of ESD protection devices based on the present disclosure and an existing technology were prepared as samples I-V, and an electrostatic discharge immunity test was performed, which is defined in IEC61000-4-2 that is a type of International Electromechanical Commission (IEC) standards.

Sample I is the ESD protection device 101 shown in the first embodiment.

Sample II is the ESD protection device 102 shown in the second embodiment.

Sample III is the ESD protection device 103 shown in the third embodiment.

Sample IV is the ESD protection device 106 shown in the sixth embodiment.

Figure 11:
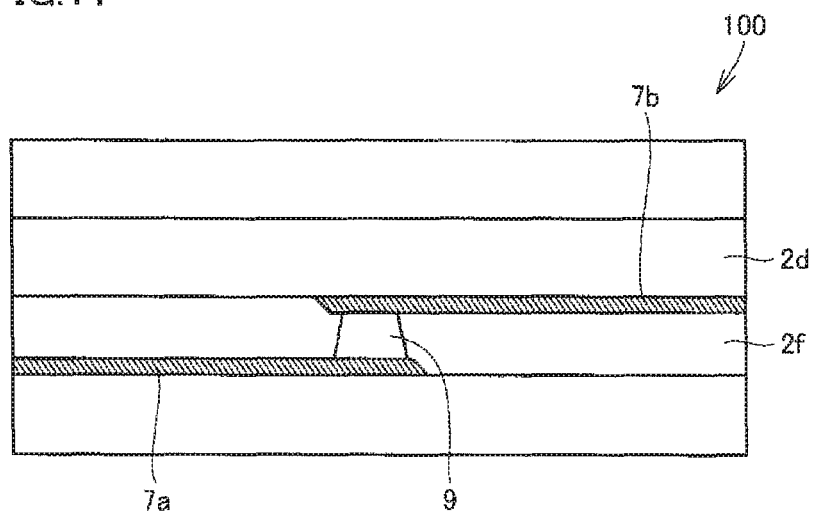
FIG. 11 is a sectional view of an ESD protection device based on an existing technology.
Figure 12:
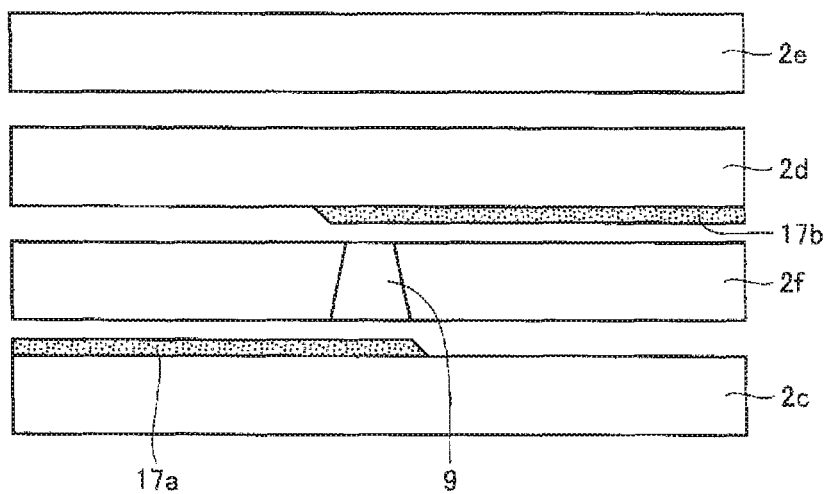
FIG. 12 is an explanation diagram of a state of the ESD protection device based on the existing technology before layer stacking.
Figure 13:
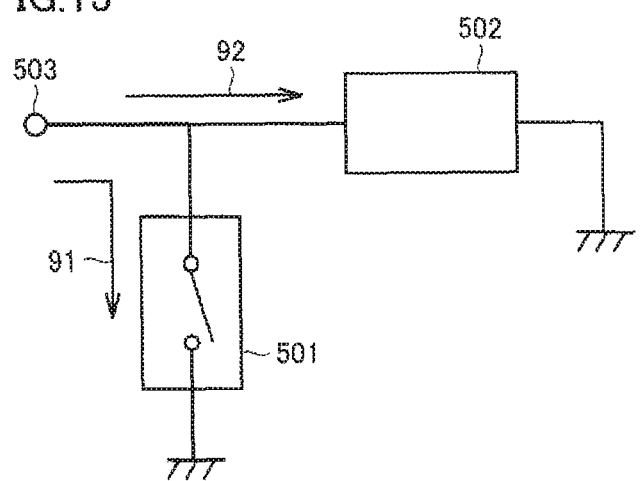
FIG. 13 is a circuit diagram in an example of a situation in which an ESD protection device is generally used.

Sample V, which is an ESD protection device based on an existing technology, is an ESD protection device 100 illustrated in FIG. 11. The ESD protection device 100 is formed by stacking ceramic layers as insulating layers. The ESD protection device 100 includes a first wiring line 7a and a second wiring line 7b. The tip of the first wiring line 7a and the tip of the second wiring line 7b face each other with the internal space of a through hole 9 therebetween. The structure illustrated in FIG. 11 was obtained by stacking insulating layers on top of one another, as illustrated in FIG. 12. In other words, an insulating layer 2f including a through hole 9 formed therein was prepared, and was arranged so as to be interposed between insulating layers 2c and 2d on which conductive pastes 17a and 17b were respectively applied by printing. Further, an insulating layer 2e including nothing formed therein was stacked on top of the insulating layer 2d, and the total of four layers were integrally fired. In this way, the ESD protection device 100 illustrated in FIG. 11 was obtained.

As an electrostatic discharge immunity test, it was determined whether or not a discharge is generated between the discharge electrodes of a sample by applying a voltage of 8 kV through a contact discharge. It can be determined whether or not a discharge has been generated between the discharge electrodes of a sample by determining whether or not a voltage is applied to a protected circuit. The level of a discharge starting voltage between the discharge electrodes of the sample can be determined on the basis of a peak voltage detected by the protected circuit. The smaller the peak voltage detected by the protected circuit, the better the function of the sample.

The evaluation results are represented as follows.

The case in which the peak voltage is below 350 V is ranked "A", which means excellent.

The case in which the peak voltage is 350 V or higher and below 500 V is ranked "B", which means good.

The case in which the peak voltage is 500 V or higher and below 600 V is ranked "C".

The case in which the peak voltage is higher than 600 V is ranked "D", which means poor.

The evaluation results are illustrated in the "ESD discharge responsiveness" column of Table 1.

TABLE 1

Table of evaluation results

| Sample | ESD discharge responsiveness | ESD repetition endurance | Overall judgment |
|---|---|---|---|
| Sample I | A | A | Excellent |
| Sample II | A | A | Excellent |
| Sample III | A | B | Good |
| Sample IV | B | C | Fair |
| Sample V (Comparative example) | C | D | Poor |

Further, to examine the repetition endurance for ESD, a voltage of 8 kV was applied to the input terminal 503 one hundred times through contact discharge, and after this, the discharge responsiveness was checked again by using the electrostatic discharge immunity test. The evaluation results at this time are shown in column "ESD repetition endurance" of Table 1.

Overall judgment was determined on the basis of two evaluation results, i.e., ESD discharge responsiveness and ESD repetition endurance, and was ranked in four stages: excellent, good, fair, and poor.

As illustrated in Table 1, samples I-III were favorable particularly in terms of discharge responsiveness in the initial state. In addition, samples I and II were favorable particularly in terms of repetition endurance. Hence, samples I and II were ranked "excellent" in overall judgment.

Sample III was favorable particularly in terms of discharge responsiveness in the initial state, but was inferior to samples I and II in terms of repetition endurance. Hence, sample III was ranked "good" in overall judgment. It can be said that sample III is excellent next to samples I and II.

Sample IV, which is "fair" in overall judgment, is inferior to samples I-III, but is excellent compared with sample V based on an existing technology and, hence, it can be said that a certain level of effect in the present disclosure is obtained also in this case.

Sample V, although the discharge responsiveness was below 600 V in the initial state, was not acceptable in terms of repetition endurance and, hence, was ranked "poor" in overall judgment.

The descriptions of the above embodiments are examples in all the respects and are not restrictive. The scope of the present disclosure is shown by the claims and not by the embodiments described above, and includes all the modifications having equivalent meaning and within the scope of the claims.

The present disclosure can be utilized in an ESD protection device.

2*a* first insulating layer, 2*b* second insulating layer, 2*c*, 2*d*, 2*e* insulating layers, 4 discharge auxiliary electrode, hollow, 6*a* first via conductor, 6*b* second via conductor, 7*a* first wiring line, 7*b* second wiring line, 10 discharge gap portion, 14 discharge auxiliary electrode material, 15 hollow-forming paste, 16*a*, 16*b* conductive paste, 17*a*, 17*b* conductive paste layers, 91, 92 arrows, 100 ESD protection device (based on an existing technology), 101, 102, 103, 104, 105, 106 ESD protection devices, 501 (general) ESD protection device, 502 protected circuit, 503 terminal

The invention claimed is:

1. An ESD protection device comprising:
   a plurality of insulating layers including a first insulating layer and a second insulating layer;
   a first wiring line attached to the first insulating layer;
   a second wiring line attached to the second insulating layer;
   a first via conductor arranged on the first wiring line; and
   a discharge gap portion being in contact with the first via conductor,
   wherein at least a portion of the first wiring line faces at least a portion of the second wiring line with the first via conductor and the discharge gap portion therebetween.

2. The ESD protection device according to claim 1, wherein the first via conductor has a tapered shape narrower at a side near the discharge gap portion.

3. The ESD protection device according to claim 1, further comprising:
   a second via conductor arranged on the second wiring line,
   wherein the second via conductor faces the first via conductor with the discharge gap therebetween.

4. The ESD protection device according to claim 3, wherein the second via conductor has a tapered shape narrower at a side near the discharge gap portion.

5. The ESD protection device according to claim 1, wherein the discharge gap portion is a hollow.

6. The ESD protection device according to claim 1, wherein a discharge auxiliary electrode is arranged in the discharge gap portion.

7. The ESD protection device according to claim 1, wherein the discharge gap portion includes a structure having, in plan view, a peripheral portion surrounded by a discharge auxiliary electrode with a hollow as a center.

8. The ESD protection device according to claim 6, wherein the discharge auxiliary electrode comprises semiconductor ceramic particles.

9. The ESD protection device according to claim 6, wherein the discharge auxiliary electrode comprises conductive particles coated with an insulating material.

10. The ESD protection device according to claim 3, wherein a structure having the first via conductor and the second via conductor faced each other with the discharge gap portion therebetween is housed so as to be arranged in a thickness direction and so as to have a thickness smaller than a combined thickness of two insulating.

11. The ESD protection device according to claim 10, wherein a discharge auxiliary electrode is arranged in the discharge gap portion.

12. The ESD protection device according to claim 1, wherein the plurality of insulating layers further includes a third insulating layer,
- the third insulating layer is arranged between the first insulating layer and the second insulating layer,
- the first via conductor is embedded in the third insulating layer, and
- a thickness of the first via conductor is less than a thickness of the third insulating layer.

* * * * *